United States Patent [19]

Scavennec et al.

[11] Patent Number: 4,620,210
[45] Date of Patent: Oct. 28, 1986

[54] PHOTOTRANSISTOR OF THE TYPE HAVING AN EMITTER-BASE HETEROJUNCTION

[76] Inventors: André Scavennec, 8, rue Emilie Deslandres, 75013 Paris; David Ankri, 86, rue de l'Amiral Roussin, 75015 Paris, both of France

[21] Appl. No.: 642,135

[22] Filed: Aug. 17, 1984

Related U.S. Application Data

[63] Continuation-in-part of Ser. No. 298,385, Sep. 1, 1981.

[30] Foreign Application Priority Data

Sep. 11, 1980 [FR] France ................ 80 19621

[51] Int. Cl.⁴ .................. H01L 27/14; H01L 31/00
[52] U.S. Cl. ........................... 357/30; 357/16
[58] Field of Search ............... 357/30, 34, 16, 56

[56] References Cited

U.S. PATENT DOCUMENTS 3,881,113   4/1975   Rideout et al. ................ 357/30

OTHER PUBLICATIONS

Ahkri et al, Design and Evaluation of a Planar GaAlAs-GaAs Bipolar Transistor, *Electronics Letters*, Jan. 3, 1980, vol. 16, No. 1, pp. 41–42.

*Primary Examiner*—James W. Davie
*Assistant Examiner*—Georgia Y. Epps
*Attorney, Agent, or Firm*—Handal & Morofsky

[57] ABSTRACT

A phototransistor comprising a substrate (9), a collector layer (2), a base layer (3), and an emitter layer (4) is disclosed. The base layer (3) is of a first composite III–V semiconductor material with a first type of doping and the emitter layer (4) is of a second composite III–V semiconductor material. A diffusion well (6), of the first type of doping extends on a main part of the emitter layer (4) down to the base layer. The remaining part of the emitter layer (4) is of a second type of doping. The main part of the emitter layer (4) has an area at least 100 times larger than the area of the remaining part. A contact layer with the second type of doping is deposited on the remaining part of the emitter layer (4) with an emitter contact on the contact layer, and a base contact on an extremity of the diffusion well (6). Such a phototransistor thus comprises a heterojunction transistor under the emitter contact and a homojunction photodiode under the diffusion well (6), and the diffusion well (6) is transparent in most of its thickness to light radiation to be detected.

4 Claims, 5 Drawing Figures

PHOTOTRANSISTOR OF THE TYPE HAVING AN EMITTER-BASE HETEROJUNCTION

This is a Continuation-in-Part Application of Application No. Ser. No. 298,385 filed Sept. 1, 1981.

BACKGROUND OF THE INVENTION

The present invention relates to a phototransistor of the type having an emitter-base heterojunction for use in optical telecommunications.

Photodetectors used for optical telecommunications must have an excellent sensitivity, i.e. must be able to detect low amplitude optical signals. Avalanche photodiodes are frequently used for this purpose. They are then associated with low noise preamplifiers. However, problems associated with avalanche operation make this solution difficult to realize, particularly at wavelengths corresponding to the optimum transmission windows of optical fibres (1.3 and 1.55 $\mu$m). Another solution consists of using a single PN or PIN photodiode associated with a preamplifier having a very low input capacitance. The input component of the preamplifier is either an e.g. GaAs field effect transistor or a bipolar transistor with a very high transition frequency (several GHz). These two solutions are compared in the article of SMITH, HOPPER and GARRET published in the journal "Optical and Quantum Electronics", 10, 1978, pp. 292–300.

The phototransistor which can be considered as the result of the monolithic integration of the photodiode and a transistor is also of some interest in photodetection because there is no input connection, provided that the photodiode and transistor elements have characteristics which are at least equivalent to those of the corresponding discrete components.

The present invention relates to a photodetector of the latter type. Besides phototransistors with a silicon homojunction, heterojunction phototransistors (of the Npn type) are known, which are essentially obtained from the materials composed of elements of columns III and V of the periodic classification of elements. They consist, for example, of GaAlAs-GaAs or InP-GaInAsP phototransistors.

All these phototransistors operate according to the same principle. The incident light is absorbed in the base layer, as well as in the free base-collector area, namely in the collector. The resulting photocurrent is superimposed on the base current of the phototransistor. There is a variation in the collector current which is equal to the primary photocurrent which multiplies the gain of the phototransistor.

With regards to heterojunction devices the phototransistor without a base contact for which the light traverses the emitter layer before being absorbed in the base layer has interesting characteristics, particularly with regards to sensitivity.

Such a phototransistor is shown in sectional form in FIG. 1. It comprises a layer 2 serving as a collector (e.g. of n-type GaAs), a layer 3 serving as the base (e.g. of p-type GaAs) and a layer 4 serving as the emitter (e.g. of N-type GaAlAs). All these layers are deposited on a substrate 12 (e.g. of N+-type GaAs). The electrical contacts are provided by the emitter contact 7 and the collector contact 9.

This type of phototransistor is described in the articles of BENEKING et al. "Electronics Letters", vol. 12, 1976, pp. 395/6, MILANO et al. "IEEE International Electron Devices Meeting", December 1979 and finally KONAGAI et al. "Journal of Applied Physics", 48, 1977, pp. 4389–4394.

Other phototransistors have a base contact. In this case the emitter layer is etched in order to metallize the contact on the base. The light can then be directly focused on to the base layer in the etched area.

Such a phototransistor is shown in FIG. 2 with the same references as in FIG. 1. The base contact carries the reference numeral 8. This type of phototransistor was described by BENOIT at the Conférence Internationale sur les Communications, Optiques, Paris 1976.

All the known devices have numerous disadvantages. The homojunction phototransistor is not very suitable for photodetection at the low wavelength levels envisaged in telecommunications by optical fibres (approx. 0.85 $\mu$m). Thus, at this wavelength silicon has a relatively low absorption coefficient necessitating a considerable thickness of the free base-collector area (equal to or above 10 $\mu$m) which is not very compatible with rapid transistor operation.

With regards to heterojunction phototransistors due note should be taken of the following points.

(a) In the case where the light traverses the emitter layer, as is the case for the phototransistor of FIG. 1, components are obtained whose emitter-base capacitance is necessarily high. For photodetection at the end of the optical fibre it is necessary to have a significant surface area with a diameter of approximately 50 $\mu$m, which, even with the low level emitter doping used in heterojunction transistors (a few $10^{16}$ cm$^{-3}$) leads to high capacitances (>5 pF). Moreover, the recombination currents, whose amplitude is proportional to the surface of the emitter-base junction limit the possibility of operating at low current necessary in low noise photodetection. Conversely the sensitivity of these components in the transmission window of the emitter is excellent due to the low recombination speed of the carriers at the emitter-base interface.

(b) If for the purpose of reducing the emitter-base capacitance and the recombination current the solution based on the locally etched emitter as for the phototransistor of FIG. 2 is adopted, there is the problem of the sensitivity reduction. Thus, the light which is absorbed in the base and collector underneath the etched portion, creates carriers whereof a by no means negligible part is recombined in the surface of the device. The free air-GaAs and also GaInAsP-air surfaces are in effect characterized by a high recombination speed ($10^5$ cm/s for GaAs) and passivation tests of these surfaces have not as yet given satisfactory results.

(c) Finally the selective etching of the emitter layer is not always easy, this operation increasing in difficulty as the base layer becomes finer, which requires a high current gain.

BRIEF SUMMARY OF THE INVENTION

The object of the present invention is to obviate these disadvantages by proposing a heterojunction phototransistor having both a low emitter capacitance and a high sensitivity.

To this end the invention recommends a change to the doping type of the emitter layer in a localized manner, which makes it possible to only retain a type N emitter (in the case of an Npn structure) in a very reduced surface area, whereas in the photosensitive area the emitter layer, which is mainly converted into a P type, retains its window function.

It is pointed out in this connection that it is conventional practice in the case of heterostructure devices using two different semiconductors, to designate dopings by capital letters (N, P) when it is a semiconductor having the widest gap, whilst small letters (n, p) are used in the case of a semiconductor with a smaller gap. Thus, the designation Npn, for example, shows both the heterostructure character and the dopings involved.

The change in the doping type can be carried out by a localized diffusion of a type P impurity (in the considered example of an n layer) (e.g. Zn in the case of GaAlAs). However, other methods are possible, such as ion implantation or epitaxial recovery.

More specifically the invention relates to a phototransistor comprising a substrate, a collector layer disposed on said substrate, a base layer disposed on said collector layer, an emitter layer disposed on said base layer, said base layer being of a first composite III–V semiconductor material with a first type of doping and said emitter layer of a second composite III–V semiconductor material, a diffusion well of said first type of doping extending on a main part of emitter layer down to said base layer, a remainder part of said emitter layer being of a second type of doping, said main part of emitter layer with said diffusion well having an area at least 100 times larger than the area of said remainder part, said collector layer having said second type of doping, a contact layer with said second type of doping on said remainder part of emitter layer, an emitter contact on said contact layer, and a base contact on an extremity of said diffusion well, said phototransistor thus comprising an heterojunction transistor under said emitter contact and an homojunction photodiode under said diffusion well, said diffusion well being transparent in most of its thickness to a light radiation to be detected.

According to another aspect, said first semiconducting material is GaAs, said second semiconducting material is GaAlAs, said first type of doping is p type and said second type of doping is n type.

According to another aspect, said first semiconducting material is GaAlAs with a first Al concentration and said second semiconducting material is GaAlAs with a second Al concentration, said second concentration being lower than said first concentration, said first type of doping is p type and second type of doping is n type.

According to still another aspect, said diffusion well has an area larger than the area of a circle of 50 μm of diameter.

BRIEF DESCRIPTION OF THE DRAWINGS

Two embodiments of the invention are described in greater detail hereinafter in nonlimitative manner with reference to the drawings following FIGS. 1 and 2 which have already been described and wherein show.

DETAILED DESCRIPTION OF THE PREFERRED EMBODIMENTS

Figure 1:
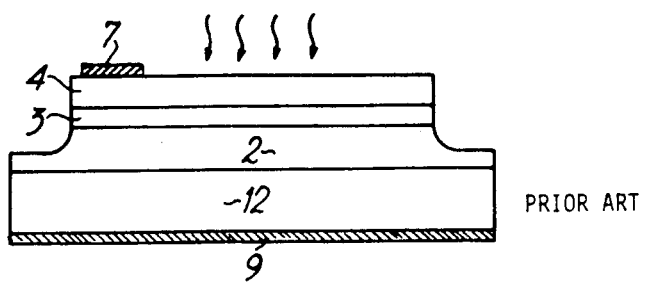
FIG. 1 shows a phototransistor without a base contact according to the prior art.
Figure 2:
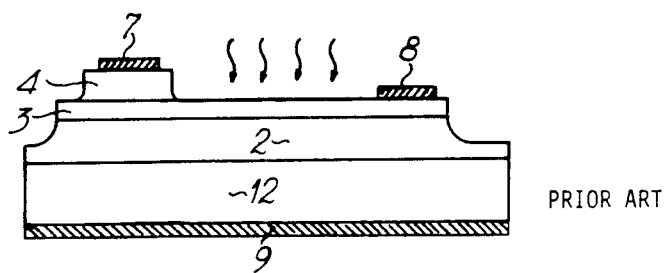
FIG. 2 shows a phototransistor with a base contact according to the prior art, FIG. 3 an Npn structure of the GaAlAs-GaAs type.
Figure 3:
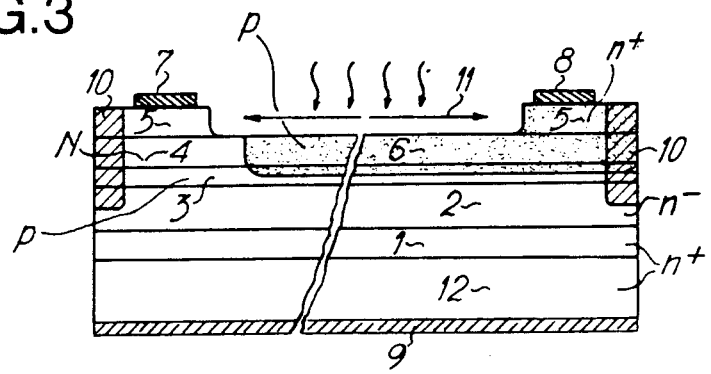
Figure 4:
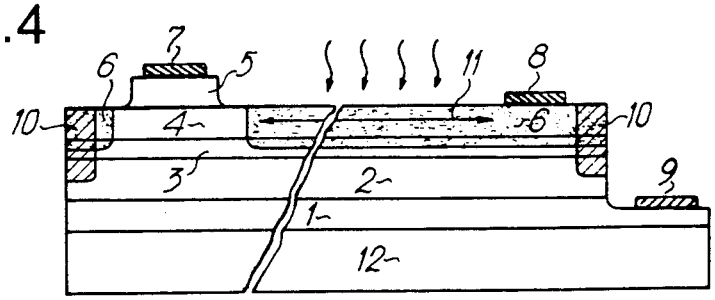
FIG. 4 the same structure with a collector contact on the upper face.

FIGS. 3 and 4 are not to scale and show the ends of the phototransistor. As will be best apparent from FIG. 5, the space occupied by the heterojunction transistor is minimal compared with the space occupied by the homojunction photodiode.

As shown in FIG. 3, the phototransistor comprises on a highly doped type n+ substrate 12 successively a buffer layer 1 of n+-GaAs, a collector layer 2 of N−-GaAs (or optionally GaAlAs), a base layer 3 of p-GaAs (or optionally GaAlAs, with an aluminium concentration below that of the emitter), an emitter layer 4 of N-GaAlAs and a contact layer 5 of n+-GaAs or GaAlAs.

The emitter-base junction is realized under conditions which, if possible, minimize the recombination current. In particular the electrical and metallurgical junctions need not necessarily coincide. It is also possible to use a semi-insulating substrate to keep the collector contact on the same face as the other contacts or for integration purposes.

A localized diffusion is carried out in the emitter layer making a p-type diffusion well 6 extending up to the base layer appear. The localization of the diffusion is carried out by means of an insulating mask in which there are diffusion windows.

The contact layer is then eliminated in the photosensitive area 11. It is only locally retained for the emitter contact 7 and optionally the base contact 8. This etching of the contact layer can be carried out prior to diffusion. It is made necessary on the one hand for transparency and also injection reasons by the lateral diode of the emitter-base junction. Thus, in connection with this junction it is only desired to retain the active heterojunction and optionally the lateral diode, but of GaAlAs only (the conduction threshold of this lateral diode being higher than that of the heterojunction).

This is followed by the deposition of the metal coatings of the emitter contact 7, base contact 8 and collector contact 9, before carrying out the electrical insulation of the component by creating insulating areas 10, e.g. by proton bombardment.

FIG. 4 shows an identical phototransistor with, however, a semi-insulating substrate 12 making it possible to place the collector contact 9 on the same face as the other contacts, which facilitates the integration of the component.

Naturally similar devices can be made from other materials. In particular for wavelengths between 1.2 and 1.6 um it is possible to use InP as the substrate material and for the other layers binary InP, ternary GaInAs or quaternary GaInAsP materials. However, they should be chosen in such a way that the reversed type area of the emitter layer is transparent to the radiation at the considered wavelength, the base and/or collector layers being of an absorbing nature.

It is pointed out that diffusion well 6 just reaches base layer 3, but at the most may extend beyond the latter to a minimum extent, whilst the diffusion well may only project beyond layer 2, by less than a few 1/10 microns. Thus, this diffused layer is transparent only in its portion 6, whereas layers 2 and 3 absorb the incident radiation. However, the absorption of light radiation participating most effectively in the photodetection phenomenon is the absorption occurring in the junction-free zone on either side of the interface between nGaAs layer 2 and pGaAs layer 3 and which would be located at the interface between zone 6 and zone 2 if the diffusion extended through the base. This free area, which must have a depth of approximately 2 to 3 μm, bearing in mind the value of the absorption coefficient, which to a small extent is distributed in the type p base layer 3 and to a larger extent in the type n layer 2, characterized by a very small doping. In addition, the type p GaAs part continues to have a limited thickness, typically less than 0.5 μm. In order to obtain a good photodetector efficiency, whilst using a low supply voltage below e.g. 10 V, the type n doping of layer 3 is given a minimum value, e.g. 1 to $3.10^{15}$ cm$^{-3}$.

Thus, the diffused layer 6 not only forms an electrical connection between contact 8 and base layer 3, but also fulfils a fundamental optical function in the photodetection process. Thus, on the one hand, it is layer 6 permitting the radiation to be detected to penetrate into its GaAs portion, and on the other hand, this layer defines, by its lower limit, the zone where photodetection will take place, namely the junction between layers 2 and 3 beneath window 11. The use of a type p diffusion obtained with zinc for forming an electrical connection with a layer within a semiconductor device is not a novel arrangement per se. it is referred to in the article by D. ANKRI and A. SCAVENNEC entitled "Design and Evaluation of a Planar GaAlAs-GaAs Bipolar Transistor", published in Electronics Letters, Jan. 3, 1980, vol. 16, no. 1, pp. 41 and 42, as well as in U.S. Pat. No. 3,881,113 (V. L. RIDEOUT et al). However, in these two documents, this diffusion is limited to the zone located directly beneath a contact, whereas in the invention, the diffusion affects almost all the device. Moreover, this diffused zone fulfils both an electrical and an optical function. It is the means by which the light penetrates, without absorption, into the device and is detected in the base—collection junction located below. This is not the case in the prior art devices described in the two aforementioned documents. In particular, in U.S. Pat. No. 3,881,113, the light emitted by the device is emitted outside the p-diffused zone which then has no optical function in the transmission of the radiation. Moreover, said diffusion completely passes through the pn junction. In the first document, the diffused zone can extend beyond the base layer without prejudicing the operation of the device. Moreover, it is also not traversed by light radiation, because the device is not a phototransistor.

Figure 5:
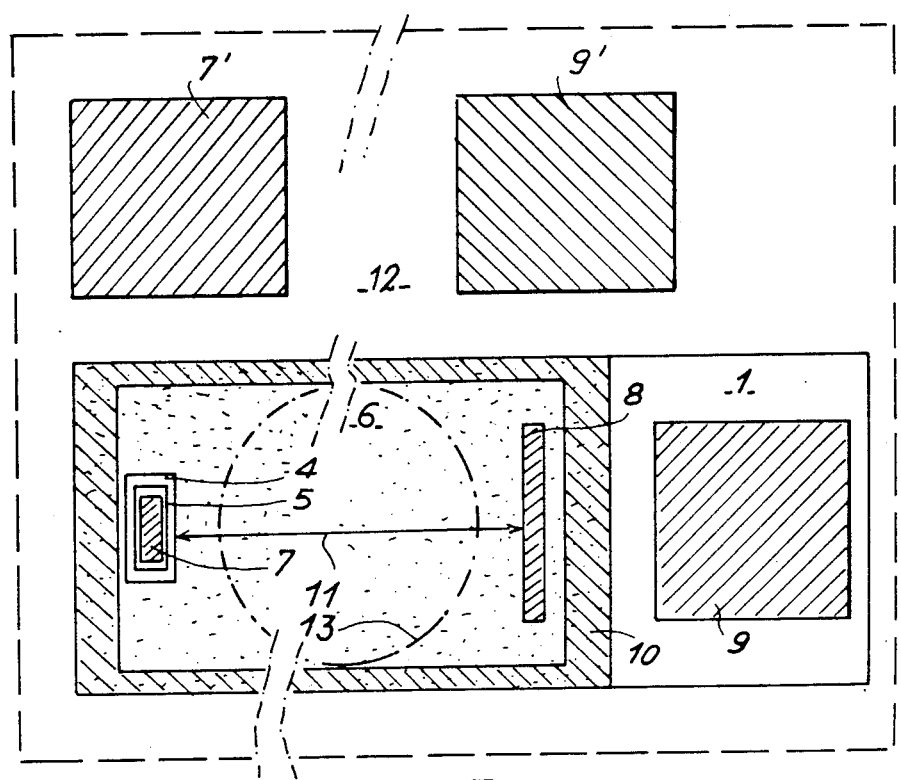
FIG. 5 a plan view of the phototransistor.

FIG. 5 is a plan view of a phototransistor according to the invention, in its variant, corresponding to FIG. 4. Whereas FIGS. 3 and 4 show the structure of the phototransistor in section along a vertical plane, FIG. 5 is a plan view stressing the relative importance of the surfaces involved in the transistor part on the one hand and the photodiode part on the other In FIG. 5, the elements already shown in preceding drawings carry the same references. It can be seen that the surface occupied by the transistor emitter occupies a very small surface compared with that which is sensitive to the radiation to be detected. More specifically, the emitter contact 7 can have dimensions 2×5 μm, whilst the emitter (layer 4) has dimensions 4×7 μm. The size of the window 11 is approximately 60 μm so that it can receive the end of an optical fibre, whose diameter is generally 50 to 60 μm and is symbolized by the broken line 13. In general terms, the window is 10 to 20 times larger than the transistor emitter. Thus, the relationship of the surfaces between the photosensitive zone and the amplification zone is typically between 100 and 500. Thus, it can be said that almost all the device is occupied by the diffusion well forming the window and by the pn junction located below said window, the transistor part occupying a minute surface.

In a subsidiary manner, FIG. 5 also shows two electrical contact plates 7' and 9' for two connections connecting two contacts 7 and 9. The system is formed on a chip 12. The insulated zone 10 surrounds the photodiode part and the transistor.

On the basis of this description, it is possible to attempt to explain the excellent behaviour of the phototransistor according to the invention. For expressing the quality of a phototransistor, the inventors use a coefficient called the "merit factor" and which is equal to a fraction, whereof the numerator is equal to the square of the capacity of the device and the denominator is equal to the product of the sensitivity of the photodiode by the gain of the transistor. The lower said merit factor, the better the phototransistor.

As a result of its special geometry, the device according to the invention considerably increases the surface available for photodetection and consequently the sensitivity of the photodiode. Moreover, the transistor gain is increased by the fact that the emitter—base junction surface is reduced, which reduces the recombination current. Thus, the denominator of the fraction expressing the merit factor is higher in the prior art. However, the fundamental advance provided by the invention is due to the considerable reduction of the numerator, i.e. due to the capacity of the device which is largely that of the forward-polarized diode formed by layer 3 (type p) and layer 4 (type n) beneath contact 7. The very small surface reserved for the transistor leads to a very small capacity. As this capacity intervenes by its square in the merit factor, the said factor is reduced to a considerable extent. For all these reasons, the merit factor of the phototransistor according to the invention is much lower than in the case of prior art devices.

What is claimed is:

1. A phototransistor comprising a substrate, a collector layer disposed on said substrate, a base layer disposed on said collector layer, an emitter layer disposed on said base layer, said base layer being of a first composite III-V semiconductor material with a first type of doping and said emitter layer of a second composite III-V semiconductor material, a diffusion well of said first type of doping extending on a main part of said emitter layer down to said base layer, a remainder part of said emitter layer being of a second type of doping, said main part of emitter layer with said diffusion well having an area of at least 100 times larger than the area of said remainder part, said collector layer having said second type of doping, a contact layer with said second type of doping on said remainder part of said emitter layer, an emitter contact on said contact layer, a base contact on an extremity of said diffusion well and a collector contact connected to said collector layer, said phototransistor thus comprising a homojunction photodiode under said diffusion well, said diffusion well being transparent in most of its thickness to light radiation to be detected to perform optical and electronic functions.

2. A phototransistor according to claim 1, wherein said first semiconducting material is GaAs, said second semiconducting material is GaAlAs, said first type of doping is p type and said second type of doping is n type.

3. A phototransistor according to claim 1, wherein said first semiconducting material is GaAlAs with a first Al concentration and said second semiconducting material is GaAlAs with a second Al concentration, said second concentration being lower than said first concentration, said first type of doping is p type and said second type of doping is n type.

4. A phototransistor according to claim 1, wherein said diffusion well has an area larger than the area of a circle of 50 μm of diameter.

* * * * *